United States Patent [19]

Ichihara

[11] Patent Number: 5,283,583
[45] Date of Patent: Feb. 1, 1994

[54] HIGH-SPEED A/D CONVERSION USING A SERIES OF ONE-BIT CONVERSION STAGES

[75] Inventor: Masaki Ichihara, Tokyo, Japan

[73] Assignee: NEC Corporation, Tokyo, Japan

[21] Appl. No.: 901,020

[22] Filed: Jun. 19, 1992

[30] Foreign Application Priority Data

Jun. 19, 1991 [JP] Japan .................................. 3-174640

[51] Int. Cl.$^5$ ............................................. H03M 1/44
[52] U.S. Cl. ...................................... 341/162; 341/127
[58] Field of Search ................. 341/127, 156, 161, 162

[56] References Cited

U.S. PATENT DOCUMENTS

| | | | |
|---|---|---|---|
| 3,599,204 | 8/1971 | Severin | 341/162 |
| 3,936,820 | 2/1976 | Goldstone et al. | 341/127 |
| 4,336,525 | 6/1982 | Chapple, III | 341/162 |
| 4,665,382 | 5/1987 | Morgan | 341/122 |
| 4,684,924 | 8/1987 | Wood | 341/122 |
| 4,691,190 | 9/1987 | Robinson | 341/97 |
| 5,017,920 | 5/1991 | French | 341/163 |
| 5,107,265 | 4/1992 | Sloane | 341/146 |

Primary Examiner—Marc S. Hoff
Attorney, Agent, or Firm—Sughrue, Mion, Zinn, Macpeak & Seas

[57] ABSTRACT

In an analog-to-digital converter, one-bit A/D conversion stages are connected in series to receive an analog signal. Each conversion stage includes a sample-and-hold circuit for sampling an analog signal from a preceding stage, a comparator for comparing it with a specified voltage level to produce a logic signal at one of two discrete levels depending on whether the signal received from the preceding stage is higher or lower than the specified level. The signal received from the preceding stage is summed with a prescribed reference voltage of one of opposite polarities depending on the level of the logic signal to produce an analog output signal. The successive conversion stages are driven so that the analog signal from each stage is transferred to the next, and the logic signals generated by the individual conversion stages are delayed so that they appear simultaneously at digital output terminals.

4 Claims, 3 Drawing Sheets

5,283,583

HIGH-SPEED A/D CONVERSION USING A SERIES OF ONE-BIT CONVERSION STAGES

BACKGROUND OF THE INVENTION

The present invention relates generally to analog-to-digital converters, and more particularly to an A/D converter comparable in speed to flash A/D converters.

Two approaches are available for analog-to-digital conversion. One is a serial method called successive approximation A/D algorithm which is basically a tree search through all possible quantization levels, where each conversion step selects the next branch to follow based on the result of the previous estimate. While it requires only one comparator, the A/D conversion process is several times slower than the sampling rate. The second approach is the parallel A/D conversion architecture, which is commonly referred to as flash A/D conversion, and provides the high speed approach to quantizing an analog signal. This architecture relies on a technique where all of the possible quantization levels are simultaneously compared to the analog input signal. To compare all the quantization levels of an N-bit A/D structure, $2^N-1$ comparators are required. As a result, shortcomings inherent in the conventional flash A/D converter are that a substantial amount of chip size is required for circuit integration and a substantial amount of energy is dissipated.

SUMMARY OF THE INVENTION

It is therefore an object of the present invention to provide a high-speed analog-to-digital converter which requires small chip size and less waste energy.

According to the present invention, the analog-to-digital converter of includes a plurality of one-bit analog-to-digital (A/D) conversion stages connected in series to an analog input terminal to which an analog signal is applied. Each of the A/D conversion stages includes a sample-and-hold circuit for sampling an analog signal from a preceding stage, a comparator for comparing the sampled signal with a specified voltage level to produce a logic signal at one of two discrete levels depending on whether the signal received from the preceding stage is higher or lower than the specified level. The signal received from the preceding stage is summed in each stage with a prescribed reference voltage of one of opposite polarities depending on the discrete level of the logic signal to produce an analog output signal. The sample-and-hold circuits of the one-bit A/D conversion stages are successively driven so that the analog output signal is transferred from one conversion stage to the next in a direction away from the input terminal, and the logic signals generated by the one-bit A/D conversion stages are delayed so that they appear simultaneously at a plurality of digital output terminals.

BRIEF DESCRIPTION OF THE DRAWINGS

The present invention will be described in further detail with reference to the accompanying drawings, in which.

DETAILED DESCRIPTION

Figure 1:
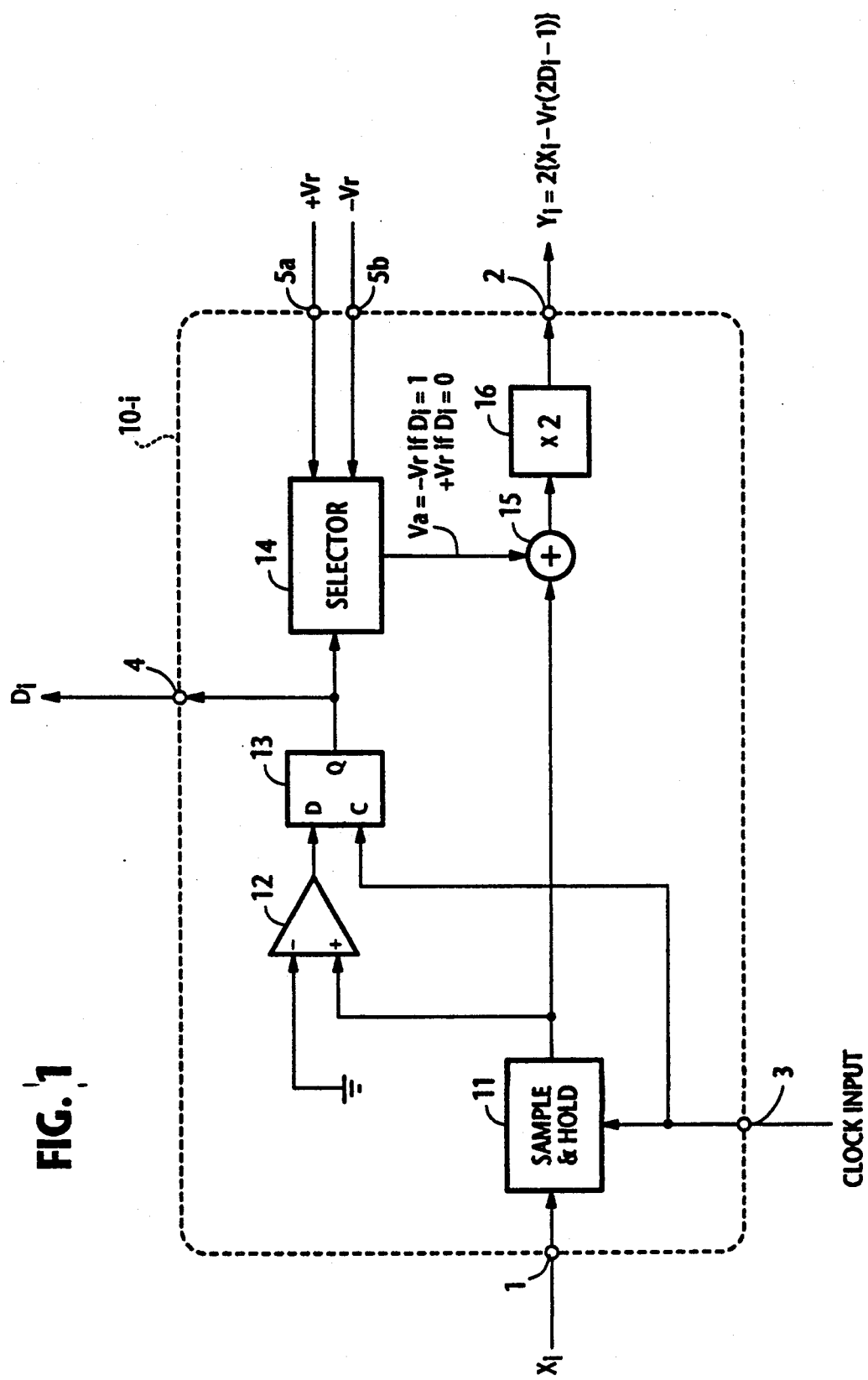
FIG. 1 is a circuit diagram of a one-bit A/D converter which is used as a basic building block in the present invention to implement an N-bit analog-to-digital converter.

In FIG. 1, there is shown a one-bit A/D converter 10-i of the present invention for an N-bit A/D converter (where i indicates the significant bit position of the one-bit A/D converter for the N-bit A/D conversion process). The one-bit A/D converter includes a sample-and-hold circuit 11 for receiving an analog input signal $X_i$ through an input terminal 1 to sample the input signal in response to a clock pulse supplied through a clock terminal 3 and hold the sampled value until the next clock pulse. The output of the sample-and-hold circuit 11 is connected to the positive input of a comparator 12 which compares the analog sample value with a zero reference voltage and produces a logic 1 if it is equal to or higher than the reference voltage and a logic 0 otherwise. Thus, the output of comparator 12 is a 1 when the analog input is at zero or positive and a 0 when it is negative. The output of comparator 12 is connected to the data input of a D-type flip-flop 13 which is clocked simultaneously with the sample-and-hold circuit 11. The Q output of flip-flop 13 is delivered through a digital output terminal 4 as a one-bit digital signal $D_i$ and further applied as a control signal to a selector 14 to which reference voltages $+V_r$ and $-V_r$ are supplied through terminals 5a, 5b. When the digital output $D_i$ is a 1, $-V_r$ is selected and when it is zero, $+V_r$ is selected. The selected reference voltage is applied as $V_a$ to an adder 15 where it is arithmetically summed with the output of sample-and-hold circuit 11. A multiply-by-2 circuit 16 is connected to the output of adder 15 to produce an analog output voltage $Y_i$ which is equal to $2(X_i+V_a)$.

Since $V_a$ is equal to $-V_r(2D_i-1)$, the following relations hold:

$$Y_i = 2\{X_i - V_r(2D_i-1)\} \quad (1)$$

$$X_i = (Y_i/2) + V_r(2D_i-1) \quad (2)$$

Therefore, the A/D converter 10 can be considered to constitute a one-bit A/D converter that produces a logic output $D_i$ depending on the polarity of the analog input voltage $X_i$.

Since the analog output signal $Y_i$ is caused to vary stepwisely by an amount of corresponding to the reference voltage $V_r$ in one of opposite senses depending on the digital output $D_i$, it will be seen that by series-connecting such one-bit A/D converters in N successive stages and having them successively compare the analog outputs of previous stages with zero reference voltage, N digital outputs from such stages will constitute a digital equivalent of the analog input at the first of the N stages, with the first stage producing a sign bit.

Figure 2:
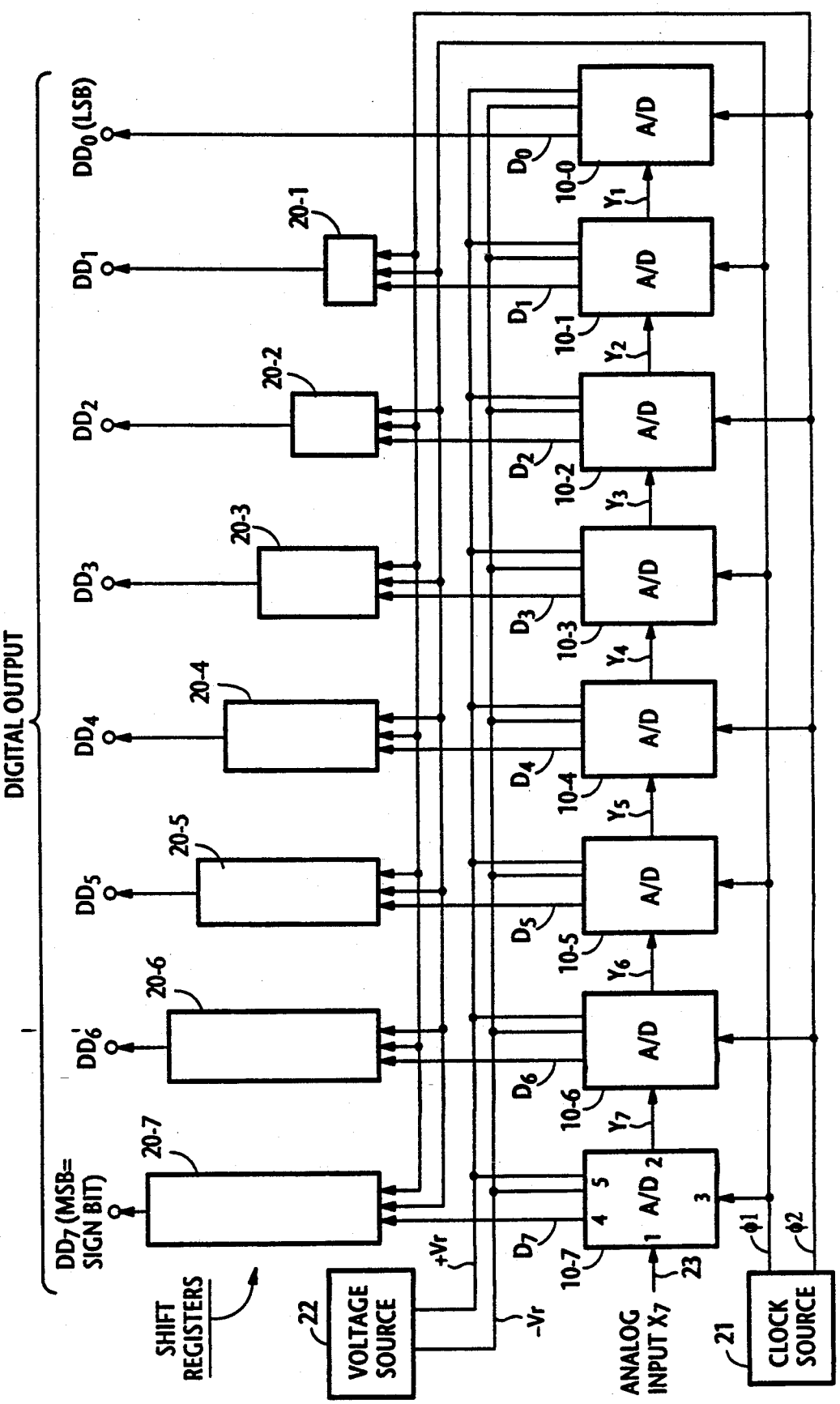
FIG. 2 is a block diagram of the A/D converter of the present invention.

FIG. 2 is a block diagram of an 8-bit A/D converter. One-bit A/D converters 10-0 through 10-7 are connected such that the analog output $Y_i$ at terminal 2 of each stage is the analog input $X_{i+1}$ to the terminal 1 of the next stage and one-bit A/D converter 10-7 is the first stage to produce a sign bit and converter 10-0 is the last stage to produce a least significant bit. Clock source 21 supplies clock pulses with opposite phases $\phi 1$ and $\phi 2$. Odd-numbered A/D converters 10 are driven by a clock pulse of phase $\phi 1$ and even-numbered A/D converters are driven by clock pulse with $\phi 2$ so that the analog samples are stepped along successive one-bit converter stages at the clock rate. Voltage source 22 feeds reference voltages $+V_r$ and $-V_r$ to all one-bit A/D converters 10. The digital output $D_0$ of one-bit converter stage 10-0 is directly connected to an output terminal $DD_0$, while the digital outputs $D_i$ of the other stages 10-1 to 10-7 are coupled respectively to shift registers 20-1 through 20-7 having one to seven stages, respectively.

Multiplying Equation (2) with a value $2^{-(N-1-i)}$ gives the following outputs from successive stages 10-7~10-0:

$$X_7 = \frac{Y_7}{2} + V_r(2D_7 - 1) \tag{3-1}$$

$$X_6 \cdot 2^{-1} = \frac{2^{-1} \cdot Y_6}{2} + V_r(2D_6 - 1) \times 2^{-1} \tag{3-2}$$

$$X_5 \cdot 2^{-2} = \frac{2^{-2} \cdot Y_5}{2} + V_r(2D_5 - 1) \times 2^{-2} \tag{3-3}$$

$$X_4 \cdot 2^{-3} = \frac{2^{-3} \cdot Y_4}{2} + V_r(2D_4 - 1) \times 2^{-3} \tag{3-4}$$

$$X_3 \cdot 2^{-4} = \frac{2^{-4} \cdot Y_3}{2} + V_r(2D_3 - 1) \times 2^{-4} \tag{3-5}$$

$$X_2 \cdot 2^{-5} = \frac{2^{-5} \cdot Y_2}{2} + V_r(2D_2 - 1) \times 2^{-5} \tag{3-6}$$

$$X_1 \cdot 2^{-6} = \frac{2^{-6} \cdot Y_1}{2} + V_r(2D_1 - 1) \times 2^{-6} \tag{3-7}$$

$$X_0 \cdot 2^{-7} = \frac{2^{-7} \cdot Y_0}{2} + V_r(2D_0 - 1) \times 2^{-7} \tag{3-8}$$

Since the relation $X_i = Y_{i+1}$ holds, the following relation is given:

$$X_7 = 2^{-8} Y_0 - \frac{2V_r(2^8 - 1)}{2^8} + 2V_r \times 2^{-7} \sum_{i=0}^{7} 2^i D_i \tag{4}$$

Equation (4) is therefore generalized for an N-bit A/D converter as follows:

$$X_{N-1} = 2^{-N} Y_0 - \frac{2V_r(2^N - 1)}{2^N} + 2V_r \times 2^{-N+1} \sum_{i=0}^{N-1} 2^i D_i \tag{5}$$

If the analog input $X_i$ of each stage is in the range between $-2V_r$ and $+2V_r$, Equation (1) can be rewritten as:

$$Y_i = 2(X_i - V_r) \text{ if } 0 < X_i < 2V_r \tag{6-1}$$

$$Y_i = 2(X_i + V_r) \text{ if } 0 > X_i > -2V_r \tag{6-2}$$

It is seen that the analog output $Y_i$ of each stage also falls in the range between $-2V_r$ and $+2V_r$.

Therefore, Equation (5) can be rewritten as:

$$-V_{max} + 2V_{max} \cdot 2^{-N} \sum_{i=0}^{N-1} 2^i D_i < X_i < -V_{max} + \tag{7}$$

$$\frac{V_{max}}{2^{N-1}} + 2V_{max} \cdot 2^{-N} \sum_{i=0}^{N-1} 2^i D_i$$

where, $V_{max}$ is equal to $2V_r$ and represents the maximum amplitude of the analog input voltage. It is seen from Equation (7) that the N-bit A/D converter divides the range between $-V_{max}$ and $+V_{max}$ into $2^N$ successive voltage intervals and each stage generates a logical 1 output if its analog input corresponds to $2^i$-th interval. An analog input voltage varying in the range of values +128 and −128 can be resolved into $2^8$ intervals using a reference voltage $V_r$ equal to a value "64".

Figure 3:
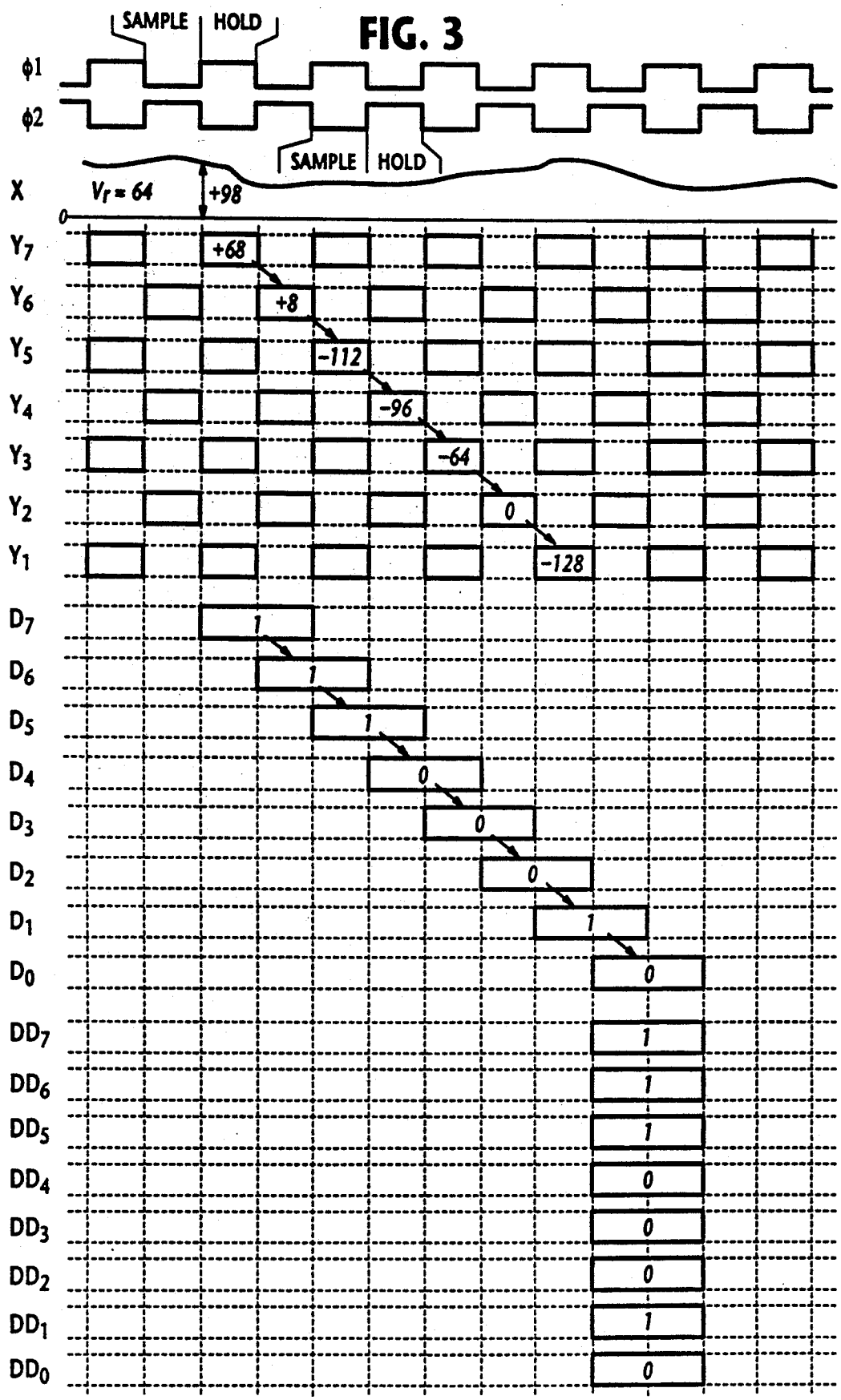
FIG. 3 is a timing diagram useful for describing the operation of the present invention.

The operation of the N-bit A/D converter will be fully understood with reference to FIG. 3. If the analog input at terminal 23 is of a positive value +98, then the analog output $Y_7$ from converter stage 10-7 is given as equal to +68 from equation (3-) and its digital output $D_7$ is a positive sign bit 1. Using the analog output $Y_7$ as an analog input, the next stage 10-6 generates a logic 1 as a digital output $D_6$ and a voltage value +8 as an analog output $Y_6$ as given by Equation (3-2). In like manner, subsequent stages 10-5~10-0 generate $Y_5 = -112$ ($D_5 = 1$), $Y_4 = -96$ ($D_4 = 0$), $Y_3 = -64$ ($D_3 = 0$), $Y_2 = 0$ ($D_2 = 0$), $Y_1 = -128$ ($D_1 = 1$), and $Y_0 = -128$ ($D_0 = 0$) in succession. Shift registers 20-0~20-7 are clocked by the same clock phases as those supplied to their corresponding A/D converter stages 10-0~10-7 so that the stored digital values "11100010" are made to appear simultaneously at their output terminals $DD_7$-$DD_0$.

Because of the significant reduction of comparators and the associated circuit elements, the present invention assures less circuit complexity with attendant reduction in chip size and power consumption. In addition, since each one-bit converter stage operates at the sampling clock rate, the N-bit A/D converter of the present invention attains substantially the same A/D conversion speed as conventional flash A/D converters.

What is claimed is:

1. An analog-to-digital converter for converting an analog signal into an N-bit digital signal, said analog-to-digital converter comprising:
   a clock source for generating a timing signal;
   (N-1) one-bit analog-to-digital (A/D) conversion stages connected in series to an analog input terminal to which said analog signal is applied, each of said (N-1) A/D conversion stages comprising:
      a sample-and-hold circuit for sampling and holding said analog signal applied thereto in response to said timing signal;
      a comparator for comparing a sampled signal with a specified voltage level and for producing a logic signal at one of two discrete levels depending on whether the sampled signal is higher or lower than the specified voltage level;
      selector means for selecting one of two reference voltages of equal magnitude and opposite polarity in accordance with the discrete level of said logic signal;
      adder means for producing an analog output signal which is a sum of the sampled signal and a selected reference voltage;
      a multiplier for doubling the magnitude of said analog output signal from said adder means and applying the doubled signal to a succeeding A/D conversion stage;
   a last one-bit A/D conversion stage, connected to an output stage of said (N-1) A/D conversion stages, comprising a last-stage sample-and-hold circuit for sampling a signal output from said output stage in response to said timing signal, and a last-stage comparator for comparing a signal sampled by the last-stage sample-and-hold circuit with said specified voltage level and producing a logic signal at one of two discrete levels depending on whether the signal sampled is higher or lower than the specified voltage level; and (N-1) shift registers associated respectively with said (N-1) one-bit A/D conversion stages for receiving and delaying logic signals supplied from each said comparator of said associated one-bit A/D conversion stages so that the delayed logic signals appear simultaneously with the logic signal from the last-stage comparator at a plurality of digital output terminals.

2. An analog-to-digital converter as claimed in claim 1, wherein said specified voltage level is zero voltage level and said prescribed reference voltage is equal to one half of a maximum value of said analog input voltage applied to said analog input terminal.

3. An analog-to-digital converter as claimed in claim 1, further comprising latch means for latching the logic signal from said comparator and supplying a latched logic signal to said selector means in response to said timing signal.

4. A method for translating an analog signal to a digital signal comprising the steps of:
 a) sampling said analog signal from an input terminal;
 b) comparing the sampled signal in step (a) with a specified voltage level and producing a first logic signal at one of two discrete levels depending on whether said sampled signal is higher or lower than the specified voltage level;
 c) selecting one of two reference voltages of equal magnitude and opposite polarity in accordance with the discrete level of the first logic signal;
 d) producing a first analog output signal which is a sum of the sampled signal and the selected reference voltage;
 e) doubling the magnitude of said first analog output signal;
 f) sampling the first analog output signal doubled in step (e);
 g) comparing the first analog output signal sampled in step (f) with said specified voltage level and producing a second logic signal at one of two discrete levels depending on whether the first analog output signal sampled is higher or lower than the specified voltage level;
 h) selecting one of said two reference voltages in accordance with the discrete level of the second logic signal;
 i) producing a second analog output signal which is a sum of the first analog output signal sampled in step (f) and the reference voltage selected in step (h);
 j) doubling the magnitude of said second analog output signal;
 k) sampling the second analog output signal doubled in step (j);
 l) comparing the second analog output signal sampled in step (k) with said specified voltage level and producing a third logic signal at one of two discrete levels depending on whether the second analog output signal sampled is higher or lower than the specified voltage level; and
 m) delaying the first and second logic signals successively generated in steps (b) and (g) so that the delayed first and second logic signals appear simultaneously with the third logic signal at a plurality of digital output terminals.

* * * * *

UNITED STATES PATENT AND TRADEMARK OFFICE
CERTIFICATE OF CORRECTION

PATENT NO. : 5,283,583
DATED : February 1, 1994
INVENTOR(S) : Masaki Ichihara

It is certified that error appears in the above-indentified patent and that said Letters Patent is hereby corrected as shown below:

Column 4, line 14, delete "(3-)" and insert —(3-1)—.

Signed and Sealed this

Second Day of August, 1994

Attest:

BRUCE LEHMAN

*Attesting Officer*      Commissioner of Patents and Trademarks